United States Patent
Zhai (10) Patent No.: US 11,984,176 B2
(45) Date of Patent: May 14, 2024

(54) METHOD AND APPARATUS OF TESTING WORD LINE TO DETECT FAULT AFTER REPAIR

(71) Applicant: CHANGXIN MEMORY TECHNOLOGIES, INC., Hefei (CN)

(72) Inventor: Yulong Zhai, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 218 days.

(21) Appl. No.: 17/662,895

(22) Filed: May 11, 2022

(65) Prior Publication Data

US 2022/0383973 A1    Dec. 1, 2022

(30) Foreign Application Priority Data

May 27, 2021  (CN) .......................... 202110584147.X (51) Int. Cl.
*G11C 29/12*    (2006.01)
(52) U.S. Cl.
CPC ...... *G11C 29/12* (2013.01); *G11C 2029/1202* (2013.01)
(58) Field of Classification Search
None
See application file for complete search history.

(56) References Cited

U.S. PATENT DOCUMENTS

| | | | | |
|---|---|---|---|---|
| 5,786,702 A * | 7/1998 | Stiegler | ................... | G11C 29/50 714/733 |
| 6,242,936 B1 * | 6/2001 | Ho | ..................... | G01R 31/3004 365/182 |
| 2002/0009006 A1 * | 1/2002 | Saitoh | .................... | G11C 29/48 365/201 |
| 2005/0036259 A1 * | 2/2005 | Hokenmaier | .......... | G11C 29/83 361/104 |
| 2007/0153596 A1 * | 7/2007 | Kilian | .................... | G11C 29/02 365/201 |

FOREIGN PATENT DOCUMENTS

CN            104376878 B      8/2018

* cited by examiner

*Primary Examiner* — J. H. Hur
(74) *Attorney, Agent, or Firm* — Cooper Legal Group, LLC (57) ABSTRACT

Embodiments of the present disclosure provide a method and an apparatus of testing a word line. After repair of a memory array is completed, if a target word line in a failure state exists in the memory array, a second numerical value is written into the target word line, and then it is determined, according to a numerical value outputted by each word line in the memory array, whether there are at least two word lines in an on-state in the memory array; if there are at least two word lines in an on-state simultaneously in the memory array, a current value generated by the target word line in an on-to-off process is detected; when the current value generated by the target word line in the on-to-off process is greater than a preset current threshold, it is determined that the target word line has a repair fault.

15 Claims, 5 Drawing Sheets

METHOD AND APPARATUS OF TESTING WORD LINE TO DETECT FAULT AFTER REPAIR

CROSS-REFERENCE TO RELATED APPLICATIONS

This application claims the priority of Chinese Patent Application No. 202110584147.X, submitted to the Chinese Intellectual Property Office on May 27, 2021, the disclosure of which is incorporated herein in its entirety by reference.

TECHNICAL FIELD

Embodiments of the present disclosure relate to the technical field of integrated circuits, and in particular, to a method and an apparatus of testing a word line.

BACKGROUND

As the memory is continuously developing to have a higher degree of integration and higher capacity, defects are more likely to occur in the memory manufacturing process. To compensate for the physical defects in the memory manufacturing process, the defective memory generally needs to be repaired to improve the memory storage performance and yield.

Currently, two repair techniques are generally used to repair circuits in a memory: laser-fuse and E-fuse. The two repair techniques are mainly used for wafer repair on the production line, and the E-fuse repair technique is also used for repair after post-packaging.

After a word line (WL) is repaired by laser-fuse or E-fuse, if the E-fuse repair is started again by mistake, the word line may fail due to double repair, and it is difficult to find such a failed word line accurately by conventional test techniques, resulting in poor test results.

SUMMARY

Embodiments of the present disclosure provide a method and an apparatus of testing a word line.

According to a first aspect, an embodiment of the present disclosure provides a method of testing a word line, where the method includes:
  after repair of a memory array is completed, detecting whether a target word line in a failure state exists in the memory array;
  if a target word line in a failure state exists in the memory array, determining, after a second numerical value is written into the target word line, whether there are at least two word lines simultaneously in an on-state in the memory array according to a numerical value outputted by each word line in the memory array;
  if there are at least two word lines simultaneously in an on-state in the memory array, detecting a current value generated by the target word line in an on-to-off process; and
  determining that the target word line has a repair fault when the current value generated by the target word line in the on-to-off process is greater than a preset current threshold.

According to a second aspect, an embodiment of the present disclosure provides an apparatus of testing a word line, where the apparatus includes:
  a first detection module, configured to: after repair of a memory array is completed, detect whether a target word line in a failure state exists in the memory array;
  a first determining module, configured to: if a target word line in a failure state exists in the memory array, determine, after a second numerical value is written into the target word line, whether there are at least two word lines simultaneously in an on-state in the memory array according to a numerical value outputted by each word line in the memory array;
  a second detection module, configured to: if there are at least two word lines simultaneously in an on-state in the memory array, detect a current value generated by the target word line in an on-to-off process; and
  a second determining module, configured to determine that the target word line has a repair fault when the current value generated by the target word line in the on-to-off process is greater than a preset current threshold.

According to a third aspect, an embodiment of the present disclosure provides a test device, including: at least one processor and a memory, where
  the memory stores computer-executable instructions; and
  the at least one processor executes the computer-executable instructions stored in the memory, such that the at least one processor executes the method of testing a word line according to the first aspect.

According to a fourth aspect, an embodiment of the present disclosure provides a computer-readable storage medium, where the computer-readable storage medium stores computer-executable instructions, and the computer-executable instructions are executed by a processor to implement the method of testing a word line provided by the first aspect.

BRIEF DESCRIPTION OF THE DRAWINGS

To describe the technical solutions in the embodiments of the present disclosure or in the prior art more clearly, the following briefly describes the accompanying drawings required for describing the embodiments of the present disclosure or the prior art. Apparently, the accompanying drawings in the following description show some embodiments of the present disclosure, and those of ordinary skill in the art may still derive other drawings from these accompanying drawings without creative efforts.

DETAILED DESCRIPTION

In order to make the objectives, technical solutions and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those of ordinary skill in the art based on the embodiments of the present disclosure without creative efforts should fall within the protection scope of the present disclosure. In addition, although disclosures in the present disclosure are presented according to one or several exemplary examples, it should be understood that each aspect of these disclosures can also individually constitute a complete implementation.

It should be noted that brief descriptions of the terms in the present disclosure are used only to facilitate the understanding of the implementations described below, and are not intended to limit the implementations of the present disclosure. Unless otherwise stated, these terms should be understood according to their ordinary and usual meanings.

In this specification, the claims, and the accompanying drawings of the present disclosure, the terms "first", "second", and so on are intended to distinguish similar or like objects or entities but do not necessarily indicate a specific order or sequence, unless otherwise noted. It should be understood that the terms used in such a way are interchangeable in proper circumstances, for example, can enable implementation in other sequences than those illustrated or described in the embodiments of the present disclosure.

In addition, the terms "including" and "having" and any variations thereof are intended to cover non-exclusive inclusion. For example, for products or devices that include a series of components, the components are not necessarily limited to those clearly listed, but may include other components not clearly listed or inherent to these products or devices.

The term "module" as used in the present disclosure refers to any known or later developed hardware, software, firmware, artificial intelligence, fuzzy logic or combination of hardware or/and software code that can perform the functions associated with the component.

In a memory chip manufacturing process, to compensate for physical defects generated in the memory manufacturing process, the defective memory generally needs to be repaired to improve the memory storage performance and yield. Two repair techniques are generally used to repair circuits in a memory: laser-fuse and E-fuse.

The repair fault mentioned in the embodiments of the present disclosure may be construed as a repair fault caused by mistakenly starting the E-fuse repair after a word line is repaired by laser-fuse, or construed as other repair faults that a plurality of word lines fail simultaneously after a certain address is repaired, which is not limited in the embodiments of the present disclosure.

For the foregoing repair fault, in conventional tests, it is difficult to accurately locate a word line that actually causes the problem. Therefore, after repair of a memory array is completed, it is difficult to accurately detect a source word line that has a repair fault by using the existing detection technology.

To solve the foregoing technical problem, an embodiment of the present disclosure provides a method of testing a word line. Through reverse detection, the method can accurately detect a source word line that causes a plurality of word lines to fail simultaneously due to a repair fault. Detailed descriptions are provided below using specific embodiments.

Figure 1:
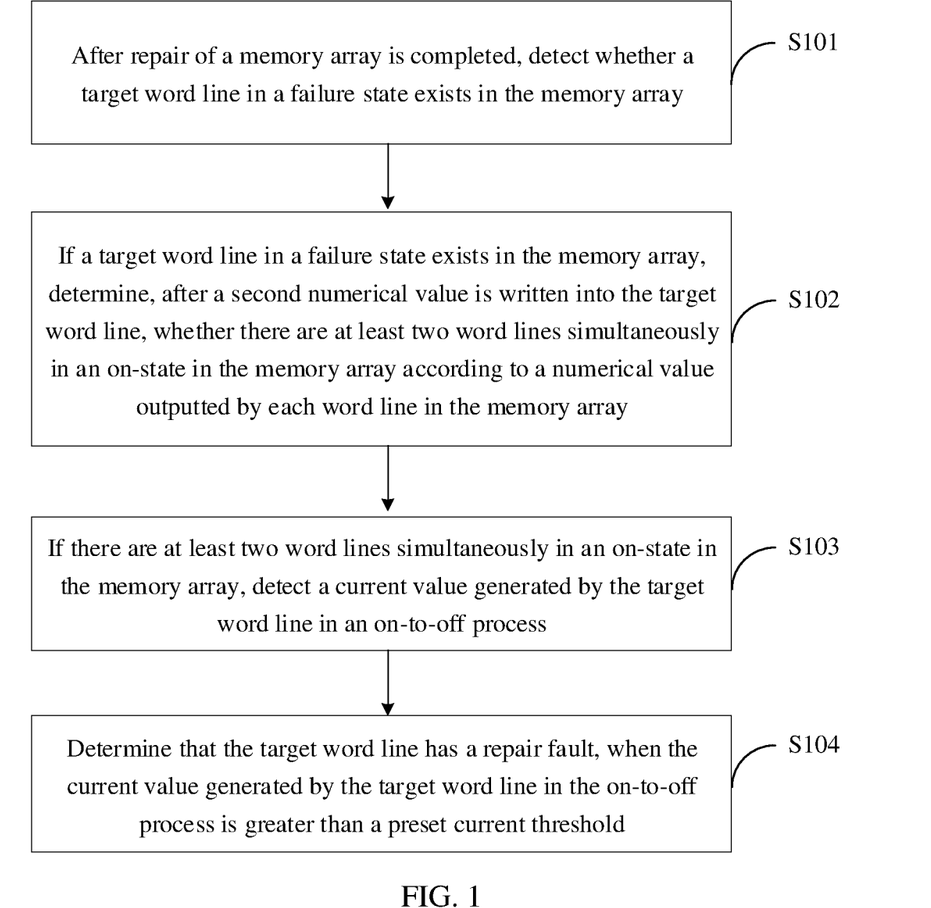
FIG. 1 is a first schematic flowchart of a method of testing a word line according to an embodiment of the present disclosure.

Referring to FIG. 1, FIG. 1 is a schematic flowchart of a method of testing a word line according to an embodiment of the present disclosure. In some embodiments, the method includes the following steps:

S101: After repair of a memory array is completed, detect whether a target word line in a failure state exists in the memory array.

In the embodiments of the present disclosure, after repair of a memory array is completed, it may be detected, through a preset detection method, whether a target word line in a failure state exists in the memory array.

For example, a specific numerical value may be first written into each word line of the memory array. Then, a numerical value outputted by each word line is read, and it is determined, according to the numerical value outputted by each word line, whether a target word line in a failure state exists in the memory array.

It may be understood that, when a word line is in a failure state, a numerical value written into the word line is different from a numerical value read from the word line. Therefore, in the embodiments of the present disclosure, after a specific numerical value is written into a certain word line, if a numerical value read from the word line is different from the written numerical value, it may be considered that the word line is in a failure state; on the contrary, if the numerical value read from the word line is consistent with the written, it can be considered that the word line is in a normal state.

S102: If a target word line in a failure state exists in the memory array, determine, after a second numerical value is written into the target word line, whether there are at least two word lines simultaneously in an on-state in the memory array according to a numerical value outputted by each word line in the memory array.

Figure 2A:
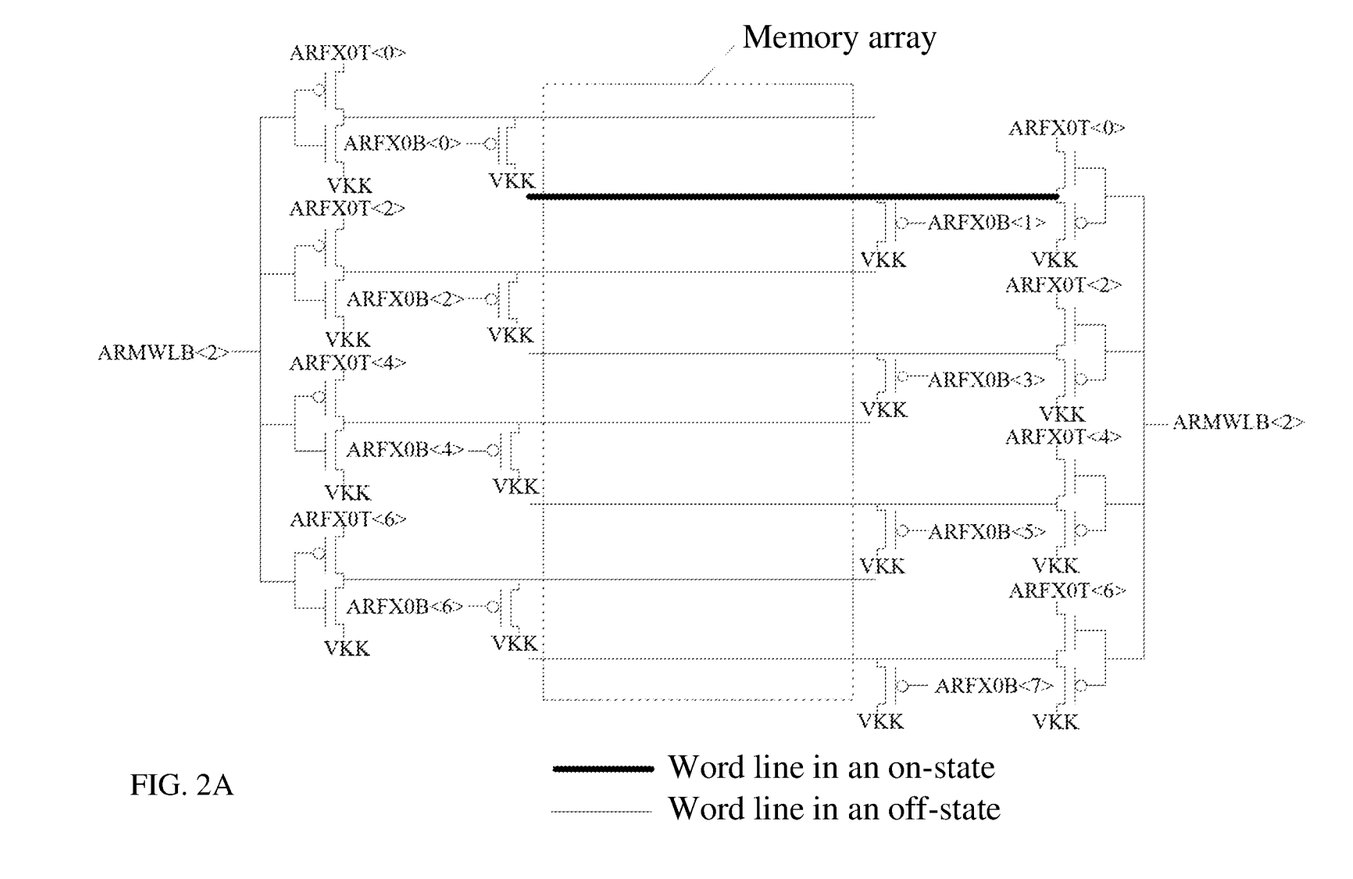
FIG. 2A is a schematic structural diagram of a memory array according to an embodiment of the present disclosure.

Referring to FIG. 2A, FIG. 2A is a schematic structural diagram of a memory array according to an embodiment of the present disclosure. Under normal circumstances, only one word line is turned on during read/write in a chip, and other word lines are in an off state. Therefore, after the second numerical value is written into the word line, only the word line outputs a related numerical value.

Figure 2B:
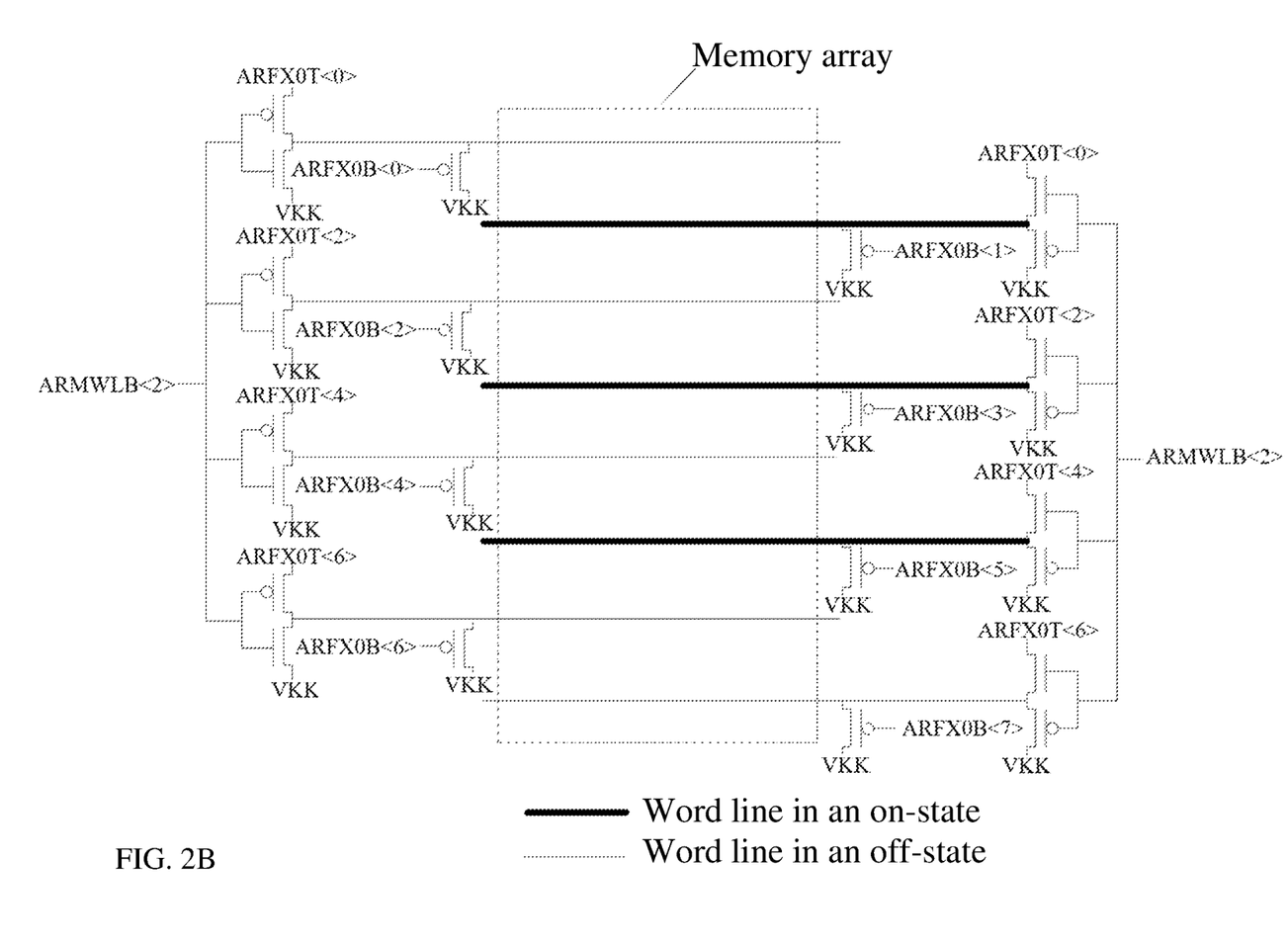
FIG. 2B is a schematic structural diagram of another memory array according to an embodiment of the present disclosure.

Referring to FIG. 2B, FIG. 2B is a schematic structural diagram of another memory array according to an embodiment of the present disclosure. When the target word line has a repair fault, a plurality of word lines will be turned on simultaneously after the target word line is turned on. In this case, after the second numerical value is written into the target word line, a plurality of word lines will output the related numerical value.

In the embodiments of the present disclosure, when it is determined that a target word line in a failure state exists in the memory array, a second numerical value is written into the target word line, and then a numerical value outputted by each word line in the memory array is read. If at least two word lines output a related numerical value, it can be determined that there are at least two word lines simultaneously in an on-state in the memory array.

S103: If there are at least two word lines simultaneously in an on-state in the memory array, detect a current value generated by the target word line in an on-to-off process.

When the target word line has a repair fault and thus causes a plurality of word lines to be in an on-state simultaneously, the current value generated by the target word line in the on-to-off process increases, which is generally several times a current value generated by the target word line in a normal state in the on-to-off process. Therefore, in the embodiments of the present disclosure, if there are at least two word lines in an on-state simultaneously in the memory array, the current value generated by the target word line in the on-to-off process can be detected; then, it is determined, according to a detection result, whether the target word line has a repair fault caused by double repair.

S104: Determine that the target word line has a repair fault when the current value generated by the target word line in the on-to-off process is greater than a preset current threshold.

In the embodiments of the present disclosure, when it is determined that the current value generated by the target word line in the on-to-off process is greater than the preset current threshold, it can be determined that the target word line has a repair fault due to double repair.

The preset current threshold is greater than a current value generated by the target word line in a normal state in the on-to-off process.

When a word line fails due to a repair fault, a plurality of word lines may be turned on at the same time, and a current value generated by a target word line in an on-to-off process will be greater than a current value in a normal state. Therefore, in the method of testing a word line provided by the embodiments of the present disclosure, after repair of a memory array is completed, if a target word line in a failure state exists in the memory array, a second numerical value is written into the target word line, and it is determined, according to a numerical value outputted by each word line in the memory array, whether there are a plurality of word lines in an on-state in the memory array; if a plurality of word lines in the memory array are in an on-state simultaneously and a current value generated by the target word line in the on-to-off process is greater than a preset current threshold, it can be determined that the target word line has a repair fault, thereby solving the technical problem in the prior art that it is difficult to accurately find a word line which fails due to a repair fault.

Figure 3:
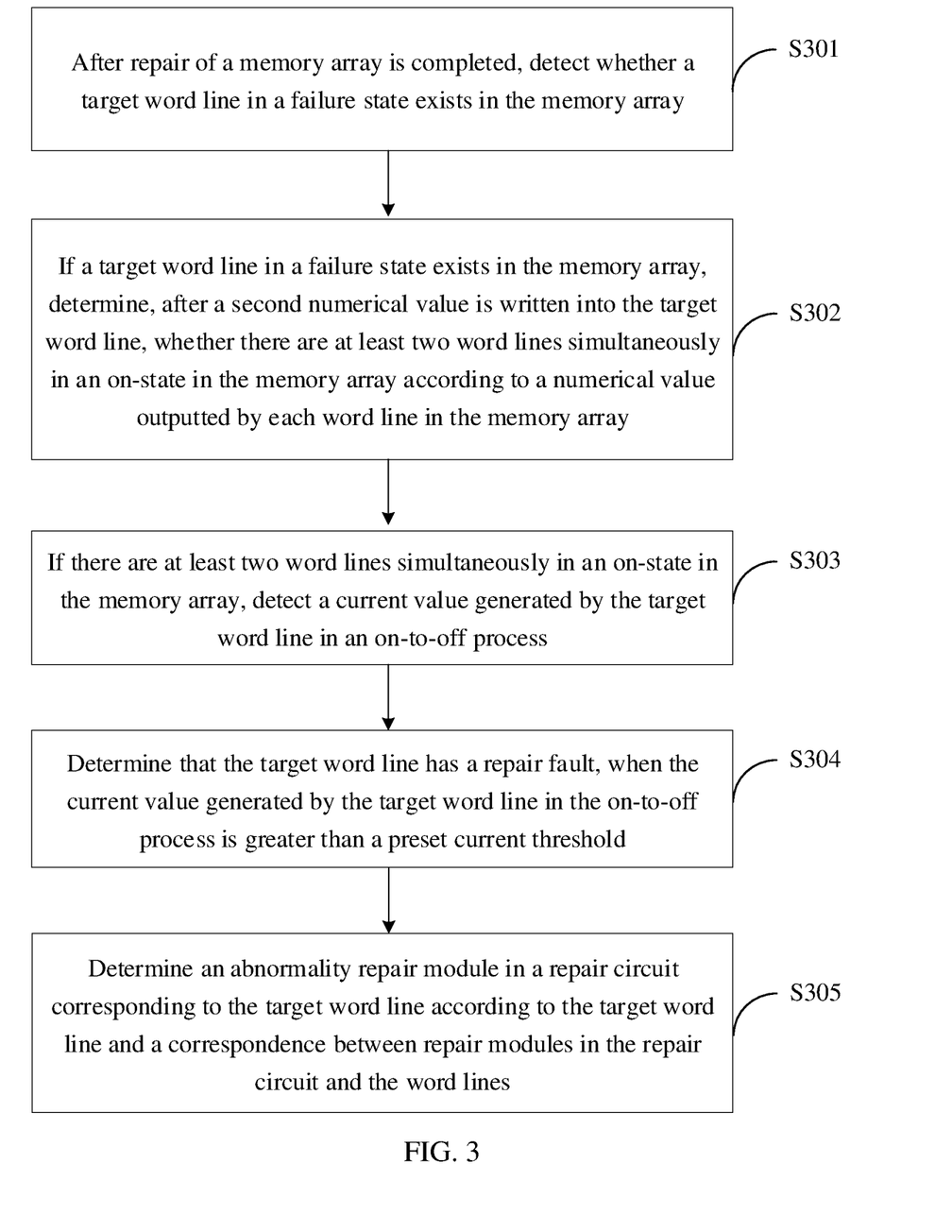
FIG. 3 is a second schematic flowchart of a method of testing a word line according to an embodiment of the present disclosure.

Based on the content described in the foregoing embodiment, referring to FIG. 3, FIG. 3 is second schematic flowchart of a method of testing a word line according to an embodiment of the present disclosure. In some embodiments, the method includes the following steps:

S301: After repair of a memory array is completed, detect whether a target word line in a failure state exists in the memory array.

In this embodiment, after repair of the memory array is completed, a first numerical value may be written into each word line in the memory array; then, a numerical value outputted by each word line in the memory array is read, and it is determined, according to the numerical value outputted by each word line, whether a target word line in a failure state exists in the memory array.

For example, after repair of the memory array is completed, 0 (low level) may be first written into each word line in the memory array, and a numerical value outputted by each word line is read. If a numerical value of 1 exists in the reading result, a word line of which the outputted numerical value is 1 (high level) among all the word lines is determined as the target word line in the failure state.

S302: If a target word line in a failure state exists in the memory array, determine, after a second numerical value is written into the target word line, whether there are at least two word lines simultaneously in an on-state in the memory array according to a numerical value outputted by each word line in the memory array.

In some embodiments, if a target word line in a failure state exists in the memory array, after 1 is written into the target word line, a numerical value outputted by each word line in the memory array is read; when at least two word lines in the memory array output a numerical value of 0, it is determined that there are at least two word lines simultaneously in an on-state in the memory array.

It can be understood that, after 1 is written into the target word line, when only the target word line is in an on-state, only the target word line in the memory array outputs 0, and other word lines has no output. If the target word line causes other word lines to be in an on-state simultaneously due to double repair, after 1 is written into the target word line, not only the target word line but also other word lines that are in the on-state simultaneously will output 0.

That is, in the embodiments of the present disclosure, if a plurality of word lines output 0 after 1 is written into the target word line, it can be considered that there are a plurality of word lines simultaneously in an on-state in the memory array.

S303: If there are at least two word lines simultaneously in an on-state in the memory array, detect a current value generated by the target word line in an on-to-off process.

S304: Determine that the target word line has a repair fault when the current value generated by the target word line in the on-to-off process is greater than a preset current threshold.

S305: Determine an abnormality repair module in a repair circuit corresponding to the target word line according to the target word line and a correspondence between repair modules in the repair circuit and the word lines.

In the embodiments of the present disclosure, after it is determined that the target word line has a repair fault, a usage status of a repair circuit in a chip can be read, and an abnormality repair module in the repair circuit corresponding to the target word line is determined according to a correspondence between repair modules in the repair circuit and the word lines.

The abnormality repair module may be an abnormal E-fuse repair module in the repair circuit.

After determining that the target word line has a repair fault, the method of testing a word line provided by the embodiments of the present disclosure can further quickly locate an abnormality repair module in the repair circuit, which helps quickly fix the exception, thereby improving the repair efficiency.

Based on the content described in the foregoing embodiment, in some embodiments of the present disclosure, the target word line is turned on when the current value generated by the target word line in the on-to-off process is greater than the preset current threshold, and a pre-configured detection device is started to detect a signal source in the memory array.

That is, in the embodiments of the present disclosure, upon determining that the current value generated by the target word line in the on-to-off process is greater than the preset current threshold, it can be preliminarily determined that the target word line has a repair fault caused by double repair. When a word line in the memory array is turned on, the word line will generate a current. Therefore, after it is preliminarily determined that the target word line has a repair fault caused by double repair, the pre-configured detection device can be started to detect a signal source in the memory array, and the number of word lines in an on-state in the memory array is determined according to the number of detected signal sources.

Optionally, the detection device may be an Emission Microscope (EMMI).

If the memory chip works normally, when one word line is turned on, the EMMI can only detect a signal source generated by one word line in the memory array; if the memory chip has a repair fault caused by double repair, after one word line is turned on, the EMMI may detect signal sources generated by a plurality of word lines in the memory array. Therefore, when there are at least two signal sources in the memory array, it can be further determined that the target word line has a repair fault.

In another embodiment of the present disclosure, after it is preliminarily determined that the target word line has a repair fault caused by double repair, a control circuit (ARMWLB) of the target word line can be used to lead out the signal through a focused ion beam (FIB), so that the word line having the repair fault is further verified by an oscilloscope.

In the method of testing a word line provided by the embodiments of the present disclosure, after it is determined through test that the target word line has a repair fault, the test result is further verified by a detection device, which can effectively improve the accuracy and reliability of the detection result, thus solving the technical problem in the prior art that it is difficult to accurately detect a word line which fails due to a repair fault.

Figure 4:
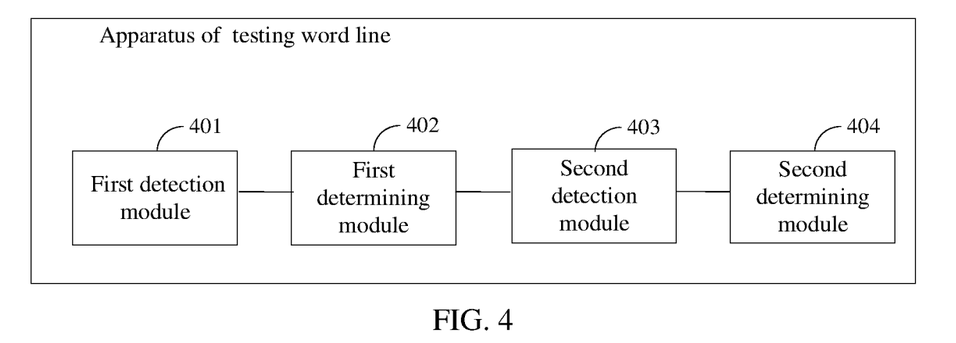
FIG. 4 is a schematic diagram of program modules of an apparatus of testing a word line according to an embodiment of the present disclosure.

Based on the content described in the foregoing embodiment, an embodiment of the present disclosure further provides an apparatus of testing a word line. Referring to FIG. 4, FIG. 4 is a schematic diagram of program modules of an apparatus of testing a word line according to an embodiment of the present disclosure. The apparatus of testing a word line includes:

a first detection module 401, configured to: after repair of a memory array is completed, detect whether a target word line in a failure state exists in the memory array;

a first determining module 402, configured to: if a target word line in a failure state exists in the memory array, determine, after a second numerical value is written into the target word line, whether there are at least two word lines simultaneously in an on-state in the memory array according to a numerical value outputted by each word line in the memory array;

a second detection module 403, configured to: if there are at least two word lines simultaneously in an on-state in the memory array, detect a current value generated by the target word line in an on-to-off process; and a second determining module 404, configured to determine that the target word line has a repair fault when the current value generated by the target word line in the on-to-off process is greater than a preset current threshold.

When a word line fails due to a repair fault, a plurality of word lines may be turned on at the same time, and a current value generated by a target word line in an on-to-off process will be greater than a current value in a normal state. Therefore, in the apparatus of testing a word line provided by the embodiments of the present disclosure, after repair of a memory array is completed, if a target word line in a failure state exists in the memory array, a second numerical value is written into the target word line, and it is determined, according to a numerical value outputted by each word line in the memory array, whether there are a plurality of word lines in an on-state in the memory array; if a plurality of word lines in the memory array are in an on-state simultaneously and a current value generated by the target word line in the on-to-off process is greater than a preset current threshold, it can be determined that the target word line has a repair fault, thereby solving the technical problem in the prior art that it is difficult to accurately find a word line which fails due to a repair fault.

In some embodiments, the first detection module 401 is specifically configured to:
determine, after a first numerical value is written into each word line in the memory array, whether a target word line in a failure state exists in the memory array according to a numerical value outputted by each word line in the memory array.

In some embodiments, the first detection module 401 is specifically configured to:
read a numerical value outputted by each word line after 0 is written into each word line in the memory array; and determine a word line of which the outputted numerical value is 1 as the target word line among all the word lines.

In some embodiments, the first determining module 402 is specifically configured to:
read a numerical value outputted by each word line in the memory array after 1 is written into the target word line; and when the numerical values outputted by at least two word lines in the memory array are 0, determine that there are at least two word lines simultaneously in an on-state in the memory array.

In some embodiments, the apparatus further includes:
a verification module, configured to turn on the target word line when the current value generated by the target word line in the on-to-off process is greater than the preset current threshold, and start a pre-configured detection device to detect a signal source in the memory array; and determine that the target word line has a repair fault if there are at least two signal sources in the memory array.

In some embodiments, the second determining module 404 is further configured to:
determine an abnormality repair module in a repair circuit corresponding to the target word line according to the target word line and a correspondence between repair modules in the repair circuit and the word lines, after determining that the target word line has a repair fault.

It should be noted that, for the content specifically executed by the first detection module 401, the first determining module 402, the second detection module 403, and the second determining module 404 described in the embodiments of the present disclosure, reference may be made to the steps in the method of testing a word line described in the embodiments shown in FIG. 1 to FIG. 2, and details are not described herein again.

Further, based on the content described in the foregoing embodiments, an embodiment of the present disclosure further provides a test device. The test device includes at least one processor and a memory. The memory stores computer-executable instructions; and the at least one processor executes the computer-executable instructions stored in the memory, to implement the steps in the method of testing a word line as described in the foregoing embodiments, and details are not described herein again.

Figure 5:
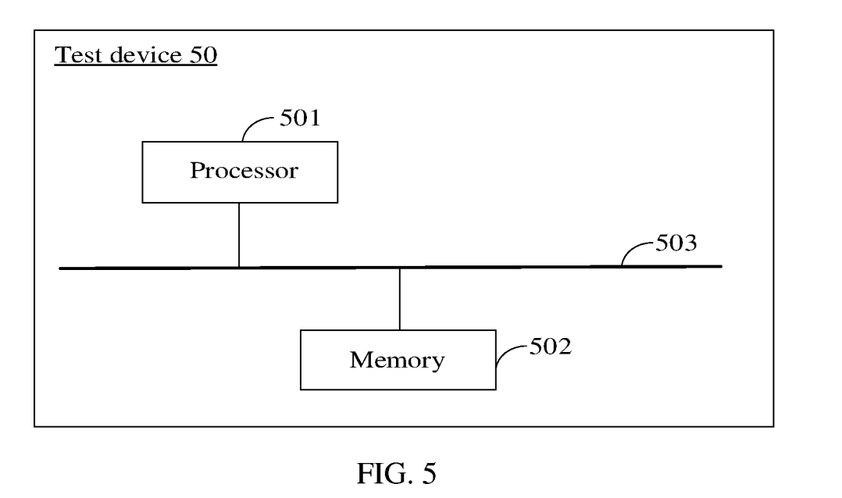
FIG. 5 is a schematic diagram of a hardware structure of a test device according to an embodiment of the present disclosure.

For better understanding of the embodiments of the present disclosure, referring to FIG. 5, FIG. 5 is a schematic diagram of a hardware structure of a test device according to an embodiment of the present disclosure.

As shown in FIG. 5, the electronic device 50 of this embodiment includes a processor 501 and a memory 502, where:
the memory 502 is configured to store computer-executable instructions; and
the processor 501 is configured to execute the computer-executable instructions stored in the memory, to implement the steps in the method of testing a word line as described in the foregoing embodiments. Reference may be made to the related description in the foregoing method embodiments, and details are not described herein again.

Optionally, the memory 502 may be independent or integrated with the processor 501.

When the memory 502 is independent, the device further includes a bus 503, configured to connect the memory 502 and the processor 501.

Further, based on the content described in the foregoing embodiments, an embodiment of the present disclosure further provides a computer-readable storage medium. The computer-readable storage medium stores computer-executable instructions. When a processor executes the computer-executable instructions, the steps in the method of testing a word line described in the foregoing embodiments are implemented. Reference may be made to the related description in the foregoing method embodiments, and details are not described herein again.

In several embodiments provided herein, it should be understood that the disclosed device and method may be implemented in other manners. For example, the described device embodiment is merely an example. For example, the module division is merely a logical function division, and there may be may be other division manners in actual implementation. For example, a plurality of modules may be combined or integrated into another system, or some features may be ignored or may not be performed. In addition, the displayed or discussed mutual couplings or direct couplings or communication connections may be implemented by using some interfaces. The indirect couplings or communication connections between the apparatuses or modules may be implemented in electric, mechanical, or other forms.

The modules described as separate parts may or may not be physically separate, and parts displayed as modules may or may not be physical units, may be located in one position, or may be distributed on a plurality of network elements. Some or all of the modules may be selected according to actual needs to achieve the objective of the solution of the embodiment.

In addition, functional units in the embodiments of the present disclosure may be integrated into one processing unit, or each of the modules may exist alone physically, or two or more modules are integrated into one unit. The unit consisting of integrated modules may be implemented in a form of hardware, or may be implemented in a form of hardware plus software functional units.

The integrated module implemented in the form of a software functional module may be stored in a computer-readable storage medium. The software functional module is stored in a storage medium and includes instructions to cause a computer device (which may be a personal computer, a server, a network device, or the like) or a processor to execute some of the steps of the methods described in the embodiments of the present disclosure.

It should be noted that, the processor may be a central processing unit (CPU), or may be a general processor, a digital signal processor (DSP), an application-specific integrated circuit (ASIC), or the like. The general processor may be a microprocessor, or the processor may also be any conventional processor. The steps of each method disclosed by the present disclosure can be directly executed by a hardware processor, or by a combination of hardware in a processor and a software module.

The memory may include a high-speed random access memory (RAM), or may further include a non-volatile memory (NVM), for example, at least one magnetic disk memory, or may further be a USB flash disk, a mobile hard disk, a read-only memory, a magnetic disk or an optical disc.

The bus may be an industry standard architecture (ISA) bus, a peripheral component interconnect (PCI) bus, an extended industry standard architecture (EISA) bus, or the like. The bus may be classified into an address bus, a data bus, a control bus, and the like. For ease of representation, the bus in the drawings of the present disclosure is not limited to only one bus or only one type of bus.

The memory may be implemented by any type of volatile or non-volatile storage device or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk or an optical disc. The storage medium may be any usable medium accessible by a general-purpose computer, a special-purpose computer.

For example, a storage medium is coupled to a processor, so that the processor can read information from the storage medium or write information into the storage medium. Certainly, the storage medium may alternatively be a component of the processor. The processor and the storage medium may be located in an application specific integrated circuit (ASIC). Certainly, the processor and the storage medium may also be located in an electronic device or a main control device.

Those of ordinary skill in the art can understand that all or some of the steps in the foregoing method embodiments may be implemented by a program instructing relevant hardware. The program may be stored in a computer-readable storage medium. When the program runs, the steps of the method embodiments are executed. The foregoing storage medium includes: any medium that can store program code, such as a ROM, a RAM, a magnetic disk, or an optical disc.

Finally, it should be noted that the above embodiments are merely used to explain the technical solutions of the present disclosure, but are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present disclosure.

The invention claimed is:

1. A method of testing a word line, comprising:
    after repair of a memory array is completed, detecting whether a target word line in a failure state exists in the memory array;
    when a target word line in a failure state exists in the memory array, determining, after a second numerical value is written into the target word line, whether there are at least two word lines simultaneously in an on-state in the memory array according to a numerical value outputted by each word line in the memory array;
    when there are at least two word lines simultaneously in an on-state in the memory array, detecting a current value generated by the target word line in an on-to-off process; and determining that the target word line has a repair fault, when the current value generated by the target word line in the on-to-off process is greater than a preset current threshold.

2. The method of testing a word line according to claim 1, wherein the detecting whether a target word line in a failure state exists in the memory array comprises:
   determining, after a first numerical value is written into each word line in the memory array, whether a target word line in a failure state exists in the memory array according to a numerical value outputted by each word line in the memory array.

3. The method of testing a word line according to claim 2, wherein the determining, after a first numerical value is written into each word line in the memory array, whether a target word line in a failure state exists in the memory array according to a numerical value outputted by each word line in the memory array comprises:
   reading a numerical value outputted by each word line after 0 is written into each word line in the memory array; and
   determining a word line of which the outputted numerical value is 1 as the target word line among all the word lines.

4. The method of testing a word line according to claim 3, wherein the determining, after a second numerical value is written into the target word line, whether there are at least two word lines simultaneously in an on-state in the memory array according to a numerical value outputted by each word line in the memory array comprises:
   reading a numerical value outputted by each word line in the memory array after 1 is written into the target word line; and
   when the numerical values outputted by at least two word lines in the memory array are 0, determining that there are at least two word lines simultaneously in an on-state in the memory array.

5. The method of testing a word line according to claim 1, wherein the determining that the target word line has a repair fault when the current value generated by the target word line in the on-to-off process is greater than a preset current threshold comprises:
   turning on the target word line when the current value generated by the target word line in the on-to-off process is greater than the preset current threshold, and starting a pre-configured detection device to detect a signal source in the memory array; and
   determining that the target word line has a repair fault when there are at least two signal sources in the memory array.

6. The method of testing a word line according to claim 5, wherein the preset current threshold is greater than a current value generated by the target word line in a normal state in the on-to-off process.

7. The method of testing a word line according to claim 1, after the determining that the target word line has a repair fault, further comprising:
   determining an abnormality repair module in a repair circuit corresponding to the target word line according to the target word line and a correspondence between repair modules in the repair circuit and the word lines.

8. A computer-readable storage medium, wherein the computer-readable storage medium stores computer-executable instructions, and the computer-executable instructions are executed by a processor to implement the method of testing a word line according to claim 1.

9. An apparatus of testing a word line, comprising:
   one or more processors; and
   a storage apparatus, configured to store one or more programs, wherein the one or more programs, when executed by the one or more processors, cause the one or more processors to execute operations of:
   detecting, after repair of a memory array is completed, whether a target word line in a failure state exists in the memory array;
   determining, when a target word line in a failure state exists in the memory array, after a second numerical value is written into the target word line, whether there are at least two word lines simultaneously in an on-state in the memory array according to a numerical value outputted by each word line in the memory array;
   detecting, when there are at least two word lines simultaneously in an on-state in the memory array, a current value generated by the target word line in an on-to-off process; and
   determining that the target word line has a repair fault when the current value generated by the target word line in the on-to-off process is greater than a preset current threshold.

10. The apparatus of testing a word line according to claim 9, wherein the one or more programs cause the one or more processors to execute operations of:
    determining, after a first numerical value is written into each word line in the memory array, whether a target word line in a failure state exists in the memory array according to a numerical value outputted by each word line in the memory array.

11. The apparatus of testing a word line according to claim 10, wherein the one or more programs cause the one or more processors to execute operations of:
    reading a numerical value outputted by each word line after 0 is written into each word line in the memory array; and
    determining a word line of which the outputted numerical value is 1 as the target word line among all the word lines.

12. The apparatus of testing a word line according to claim 11, wherein the one or more programs cause the one or more processors to execute operations of:
    reading a numerical value outputted by each word line in the memory array after 1 is written into the target word line; and
    when the numerical values outputted by at least two word lines in the memory array are 0, determining that there are at least two word lines simultaneously in an on-state in the memory array.

13. The apparatus of testing a word line according to claim 9, wherein the one or more programs further cause the one or more processors to execute operations of:
    turning on the target word line when the current value generated by the target word line in the on-to-off process is greater than the preset current threshold, and starting a pre-configured detection device to detect a signal source in the memory array; and determining that the target word line has a repair fault when there are at least two signal sources in the memory array.

14. The apparatus of testing a word line according to claim 13, wherein the preset current threshold is greater than a current value generated by the target word line in a normal state in the on-to-off process.

15. The apparatus of testing a word line according to claim 9, wherein the one or more programs cause the one or more processors to execute operations of:

determining an abnormality repair module in a repair circuit corresponding to the target word line according to the target word line and a correspondence between repair modules in the repair circuit and the word lines, after determining that the target word line has a repair fault.

\* \* \* \* \*